United States Patent
Jiang et al.

(10) Patent No.: US 10,732,470 B2
(45) Date of Patent: Aug. 4, 2020

(54) ARRAY SUBSTRATE, METHOD FOR MANUFACTURING THE SAME, LIQUID CRYSTAL DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Liangliang Jiang, Beijing (CN); Lei Guo, Beijing (CN); Ke Dai, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 16/050,276

(22) Filed: Jul. 31, 2018

(65) Prior Publication Data

US 2019/0129264 A1    May 2, 2019

(30) Foreign Application Priority Data

Oct. 26, 2017 (CN) .......................... 2017 1 1014395

(51) Int. Cl.
| | | |
|---|---|---|
| *G02F 1/1362* | (2006.01) | |
| *H01L 27/12* | (2006.01) | |
| *G02F 1/1333* | (2006.01) | |
| *G02F 1/1368* | (2006.01) | |
| *G02F 1/133* | (2006.01) | |

(Continued)

(52) U.S. Cl.
CPC ...... *G02F 1/136213* (2013.01); *G02F 1/1368* (2013.01); *G02F 1/13306* (2013.01); *G02F 1/133345* (2013.01); *G02F 1/134363* (2013.01); *H01L 27/1248* (2013.01); *H01L 27/1262* (2013.01); *G02F 1/13439* (2013.01);
(Continued)

(58) Field of Classification Search
CPC ......... G02F 1/136213; G02F 1/134363; G02F 1/1368; G02F 1/13439; G02F 1/13306; G02F 2203/21; G02F 1/133345; H01L 27/1248; H01L 27/1262
See application file for complete search history.

(56) References Cited

U.S. PATENT DOCUMENTS

| | | | | |
|---|---|---|---|---|
| 5,417,883 A | * | 5/1995 | Epstein .................. | C09K 19/02 252/299.01 |
| 6,788,874 B1 | * | 9/2004 | Ishikawa ............ | G02B 6/02033 385/122 |

(Continued)

*Primary Examiner* — Hoan C Nguyen
(74) *Attorney, Agent, or Firm* — Nath, Goldberg & Meyer; Joshua B. Goldberg

(57) ABSTRACT

An array substrate, a method for manufacturing the same, a liquid crystal display panel, and a display device are provided. The array substrate includes a first electrode, a second electrode, an insulation layer provided between the first electrode and the second electrode and a film thickness adjustment layer provided between the first electrode and the second electrode. The film thickness adjustment layer is made of a negative thermal expansion material, and is configured to adjust a distance between the first electrode and the second electrode.

20 Claims, 3 Drawing Sheets

(51) Int. Cl.
*G02F 1/1343* (2006.01)
*G02F 1/1337* (2006.01)

(52) U.S. Cl.
CPC ............. *G02F 1/133707* (2013.01); *G02F 2001/134372* (2013.01); *G02F 2203/21* (2013.01)

(56) References Cited

U.S. PATENT DOCUMENTS

| | | | |
|---|---|---|---|
| 2004/0196422 A1* | 10/2004 | Arai | G02F 1/1333 349/114 |
| 2006/0267891 A1* | 11/2006 | Nishimura | G02F 1/133555 345/87 |
| 2009/0059110 A1* | 3/2009 | Sasaki | G02F 1/134363 349/39 |
| 2009/0231530 A1* | 9/2009 | Nishimura | G02F 1/1323 349/129 |
| 2014/0175396 A1* | 6/2014 | Lee | H01L 51/56 257/40 |
| 2016/0139445 A1* | 5/2016 | Zhu | G02F 1/13394 349/106 |
| 2017/0273188 A1* | 9/2017 | Su | B32B 15/04 |
| 2018/0217422 A1* | 8/2018 | Kojima | G02F 1/1339 |
| 2019/0114457 A1* | 4/2019 | Li | G06K 9/00 |

* cited by examiner

ARRAY SUBSTRATE, METHOD FOR MANUFACTURING THE SAME, LIQUID CRYSTAL DISPLAY PANEL AND DISPLAY DEVICE

CROSS-REFERENCE TO RELATED APPLICATIONS

The present application claims the priority of the Chinese Patent Application No. 201711014395.0, filed on Oct. 26, 2017, the contents of which are incorporated herein in their entirety by reference.

TECHNICAL FIELD

The present disclosure relates to the field of display technology, and in particular, relates to an array substrate, a method for manufacturing the same, a liquid crystal display panel, and a display device.

BACKGROUND

Among existing thin film transistor liquid crystal display (TFT-LCD) panels, a TFT-LCD panel using an advanced super dimensional switching (ADS) technology has the advantages of high transmittance, wide viewing angle, and the like, and has been rapidly developed. Generally, during normal operations of the liquid crystal display panel, to prevent liquid crystal polarization, the polarity of a voltage applied to a pixel electrode of the liquid crystal display panel is alternately switched between a positive polarity and a negative polarity relative to the voltage Vcom at a common electrode of the liquid crystal display panel.

SUMMARY

Embodiments of the present disclosure provide an array substrate, a method for manufacturing the same, a liquid crystal display panel, and a display device.

Some embodiments of the present disclosure provide an array substrate, which includes:
a first electrode;
a second electrode;
an insulation layer provided between the first electrode and the second electrode; and
a film thickness adjustment layer provided between the first electrode and the second electrode, made of a negative thermal expansion material, and configured to adjust a distance between the first electrode and the second electrode.

In an embodiment, the negative thermal expansion material includes at least one of metal-ceramic composite, scandium trifluoride crystal, and zirconium tungstate.

In an embodiment, the insulation layer includes a gate insulation layer and a passivation layer, and the gate insulation layer is proximal to the first electrode relative to the passivation layer.

In an embodiment, the film thickness adjustment layer is provided between the gate insulation layer and the passivation layer.

In an embodiment, the film thickness adjustment layer is provided between the gate insulation layer and the first electrode.

In an embodiment, a thermal expansion coefficient of the negative thermal expansion material is in a range from about $-27 \times 10^{-6} K^{-1}$ to about $-5 \times 10^{-6} K^{-1}$.

In an embodiment, the array substrate further includes a thin film transistor, wherein the thin film transistor includes an active layer provided in a layer where the film thickness adjustment layer is located and a gate provided in a layer where the first electrode is located.

In an embodiment, a thickness of the active layer is equal to or less than a minimum thickness of the film thickness adjustment layer after the film thickness adjustment layer shrinks due to being heated.

In an embodiment, the array substrate further includes a thin film transistor, wherein the thin film transistor includes an active layer and a gate which are provided in a layer where the film thickness adjustment layer is located, and the active layer and the gate overlap each other in a stacking direction of the array substrate.

In an embodiment, a total thickness of the gate and the active layer is equal to or less than a minimum thickness of the film thickness adjustment layer after the film thickness adjustment layer shrinks due to being heated.

In an embodiment, a distance between the first electrode and the second electrode before the film thickness adjustment layer is heated is H1, and a distance between the first electrode and the second electrode after the film thickness adjustment layer is heated is H2, a difference value between the H1 and the H2 being greater than about 1 nm.

In an embodiment, a thickness of the film thickness adjustment layer is greater than about 0.5 μm.

Some embodiments of the present disclosure provide a liquid crystal display panel including the array substrate provided by an embodiment of the present disclosure.

In an embodiment, the liquid crystal display panel further includes a color filter substrate, wherein a liquid crystal layer is provided between the color filter substrate and the array substrate, a turned-on voltage Vgh at a gate of a thin film transistor of the array substrate, a turned-off voltage Vgl at the gate, a liquid crystal capacitance Clc of the liquid crystal layer, a storage capacitance Cst formed between the first electrode and the second electrode, a coupling capacitance Cgs between the gate and a source of the thin film transistor, and a feed-through voltage Δvp establish the following equation:

$$\Delta Vp = \frac{Cgs}{Cgs + Clc + Cst}(Vgl - Vgh);$$

and
an absolute value of the feed-through voltage ΔVp remains constant or reduces.

Some embodiments of the present disclosure provide a display device including the liquid crystal display panel provided by an embodiment of the present disclosure.

Some embodiments of the present disclosure provide a method for manufacturing an array substrate, including steps of:
forming a first electrode;
forming a film thickness adjustment layer on the first electrode by using a negative thermal expansion material;
forming an insulation layer on the film thickness adjustment layer; and
forming a second electrode on the insulation layer.

In an embodiment, the step of forming a film thickness adjustment layer on the first electrode by using a negative thermal expansion material includes a step of forming a film thickness adjustment layer on the first electrode by using at least one of metal-ceramic composite, scandium trifluoride crystal, and zirconium tungstate.

In an embodiment, the step of forming an insulation layer on the film thickness adjustment layer includes a step of forming a gate insulation layer and a passivation layer on the film thickness adjustment layer, so that the gate insulation layer is proximal to the first electrode relative to the passivation layer.

In an embodiment, the step of forming a film thickness adjustment layer on the first electrode by using a negative thermal expansion material includes a step of forming a film thickness adjustment layer on the first electrode by using a negative thermal expansion material having a thermal expansion coefficient in a range from about $-27 \times 10^{-6} K^{-1}$ to about $-5 \times 10^{-6} K^{-1}$.

In an embodiment, the step of forming a film thickness adjustment layer includes a step of forming a film thickness adjustment layer having a thickness greater than about 0.5 μm.

DETAILED DESCRIPTION

For better understanding the technical solutions of the present disclosure by one of ordinary skill in the art, the present disclosure will be further described in detail below with reference to the accompanying drawings and embodiments. Hereinafter, a same reference sign denotes same or similar features throughout the present disclosure, and description of a subsequent embodiment overlapping with that of a previous embodiment may be omitted.

The inventors of the present disclosure have found at least the following problems existing in the prior art. When the voltage at a gate of a transistor of an array substrate is switched from a high level Vgh in the turned-on state to a low level Vgl in the turned-off state, due to the presence of parasitic capacitance (e.g., the capacitance formed between the gate and a source of the transistor), an actual voltage applied to a data line (or a pixel electrode) for a pixel deviates from the desired voltage by an offset voltage ΔVp, and this offset voltage ΔVp is generally referred to as a feed-through voltage. Due to the presence of the feed-through voltage ΔVp, a positive pixel voltage and a negative pixel voltage which are alternately applied to a pixel electrode both are shifted in a same direction (i.e., both are increased or decreased by the absolute value of the feed-through voltage ΔVp), and thus difference values of the positive pixel voltage and the negative pixel voltage, which are alternately applied to the pixel electrode, relative to a common voltage at a common electrode are asymmetrical (i.e., the absolute values of the difference values are not equal to each other). As a result, a liquid crystal display panel including the array substrate suffers from a serious flicker problem. The flicker problem not only reduces the quality of a product but also causes visual fatigue to human eyes or even dizziness. In addition, as the operation time of the liquid crystal display panel increases, the temperatures of various components (e.g., a backlight, the array substrate, a liquid crystal layer, etc.) of the liquid crystal display panel gradually may increase, and the flicker phenomenon of the liquid crystal display panel may become more and more serious.

Therefore, it is desirable to provide an array substrate, a method for manufacturing the same, a liquid crystal display panel, and a display device, which can mitigate or eliminate the above flicker phenomenon.

Figure 1:
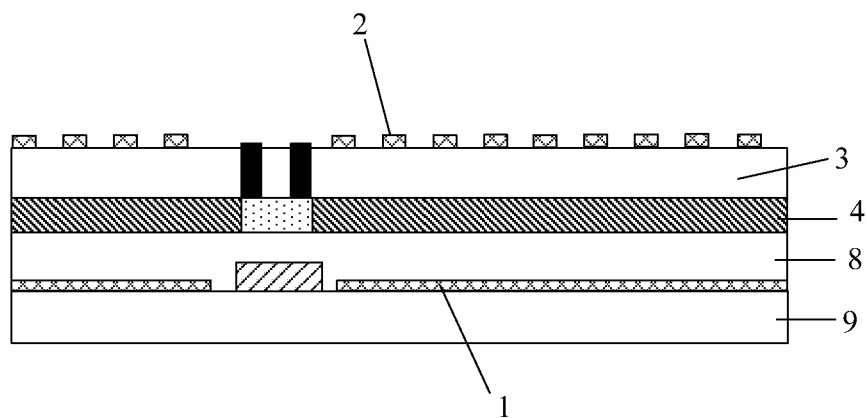
FIG. 1 is a schematic diagram showing a structure of an array substrate according to an embodiment of the present disclosure.
Figure 4:
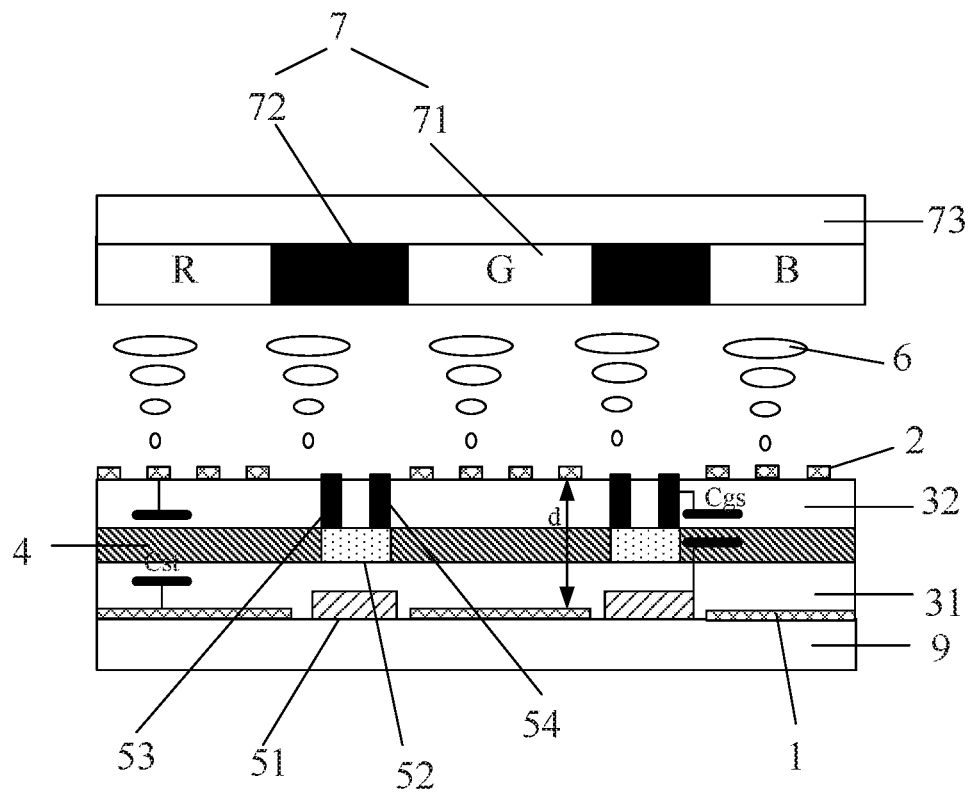
FIG. 4 is a schematic diagram showing a structure of a liquid crystal display panel according to an embodiment of the present disclosure.

An embodiment of the present disclosure provides an array substrate. As shown in FIG. 1, the array substrate includes a first electrode 1, a second electrode 2, and an insulation layer 3 provided between the first electrode 1 and the second electrode 2. A film thickness adjustment layer 4 is further provided between the first electrode 1 and the second electrode 2. For example, the film thickness adjustment layer 4 may be provided between the insulation layer 3 and the first electrode 1. The film thickness adjustment layer 4 is made of a negative thermal expansion material, and is configured to adjust a distance between the first electrode 1 and the second electrode 2. In an embodiment, the first electrode 1, the film thickness adjustment layer 4, the insulation layer 3 and the second electrode 2 may be formed sequentially on a base substrate (e.g., a transparent glass substrate) 9. Optionally, a planarization layer 8 made of an insulation material may be formed between the first electrode 1 and the film thickness adjustment layer 4. The first electrode 1 may be a common electrode configured to receive a common voltage, and the second electrode 2 may be a pixel electrode configured to receive a pixel voltage (which may also be referred to as a data voltage). As is appreciated by one of ordinary skill in the art, storage capacitance Cst (as shown in FIG. 4) will be formed between the first electrode 1 and the second electrode 2, and a value of the storage capacitance Cst is inversely proportional to a distance between the first electrode 1 and the second electrode 2.

The first electrode 1 and the second electrode 2 of the array substrate according to the present embodiment are insulated from each other, and the film thickness adjustment layer 4 made of a negative thermal expansion material is provided between the first electrode 1 and the second electrode 2, in a case where the array substrate is powered on, temperatures of various components, including the film thickness adjustment layer 4, of the array substrate will increase, due to operation under being powered on, exposure to light, and the like. The film thickness adjustment layer 4 shrinks as the temperature thereof increases, and thus a distance between the first electrode 1 and the second electrode 2 is reduced. Therefore, the storage capacitance Cst is increased, and an absolute value of the feed-through voltage ΔVp will remain constant or reduce (reference may be made to the subsequent description made in conjunction with FIG. 4), thereby mitigating or eliminating the flicker defect of the array substrate.

Figure 2:
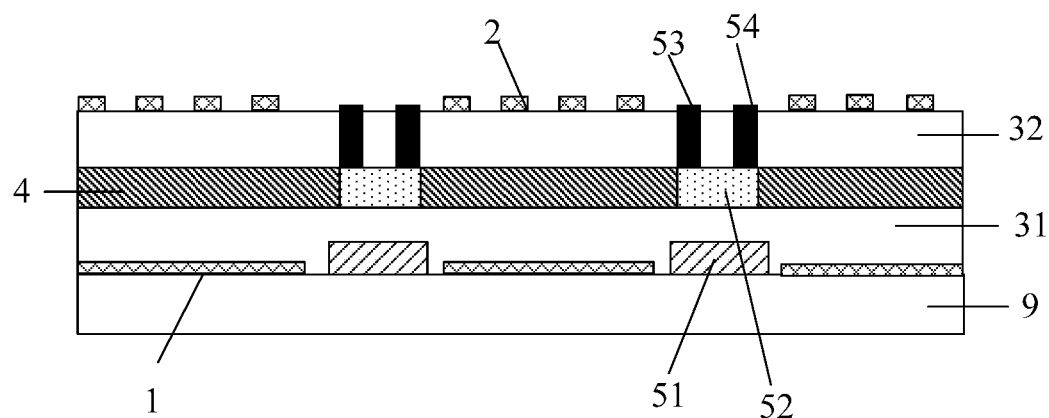
FIG. 2 is a schematic diagram showing a structure of another array substrate according to an embodiment of the present disclosure.
Figure 3:
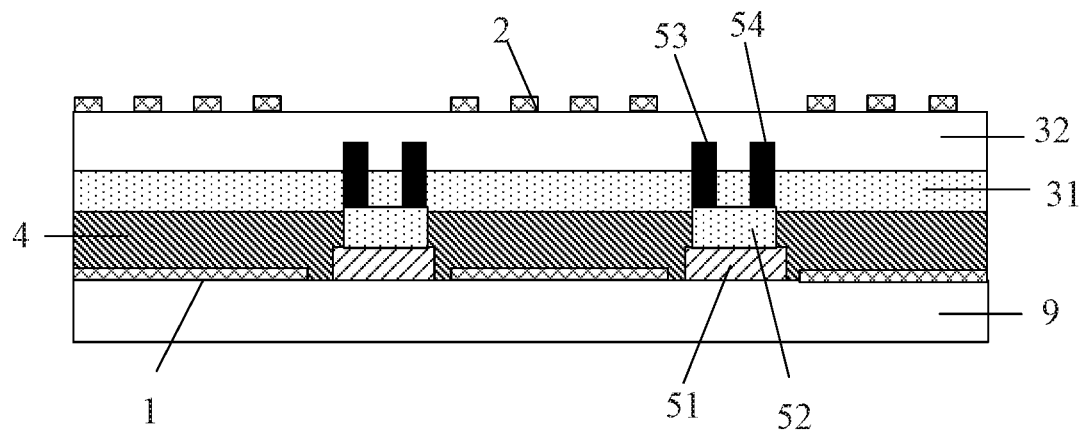
FIG. 3 is a schematic diagram showing a structure of still another array substrate according to an embodiment of the present disclosure.

An embodiment of the present disclosure provides another array substrate. As shown in FIG. 2, the array substrate includes a base substrate 9, and a first electrode 1 and a second electrode 2 provided on the base substrate 9. A gate insulation layer 31, a transparent film thickness adjustment layer 4 and a passivation layer 32 are provided between the first electrode 1 and the second electrode 2. The film thickness adjustment layer 4 is made of a negative thermal expansion material, and is configured to adjust a distance between the first electrode 1 and the second electrode 2. An embodiment of the present disclosure provides another array substrate. As shown in FIG. 3, the array substrate includes a base substrate 9, and a first electrode 1, a transparent film thickness adjustment layer 4, a gate insulation layer 31, a passivation layer 32, and a second electrode 2 provided sequentially on the base substrate 9. The film thickness adjustment layer 4 is made of a negative thermal expansion material, and is configured to adjust a distance between the first electrode 1 and the second electrode 2.

Figure 6:
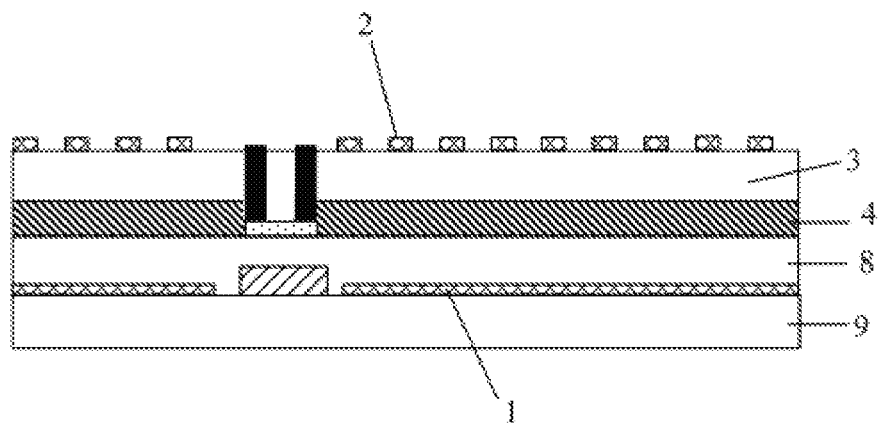
FIG. 6 is a schematic diagram showing a structure of another array substrate according to an embodiment of the present disclosure.
Figure 7:
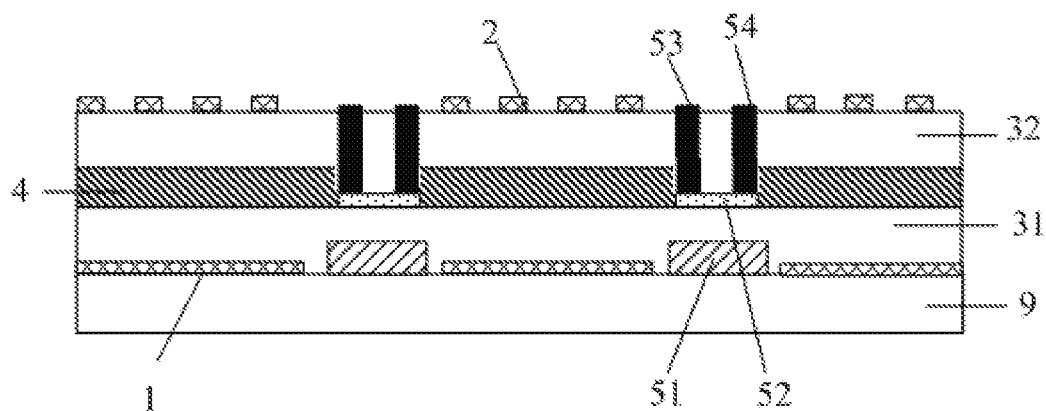
FIG. 7 is a schematic diagram showing a structure of another array substrate according to an embodiment of the present disclosure.
Figure 8:
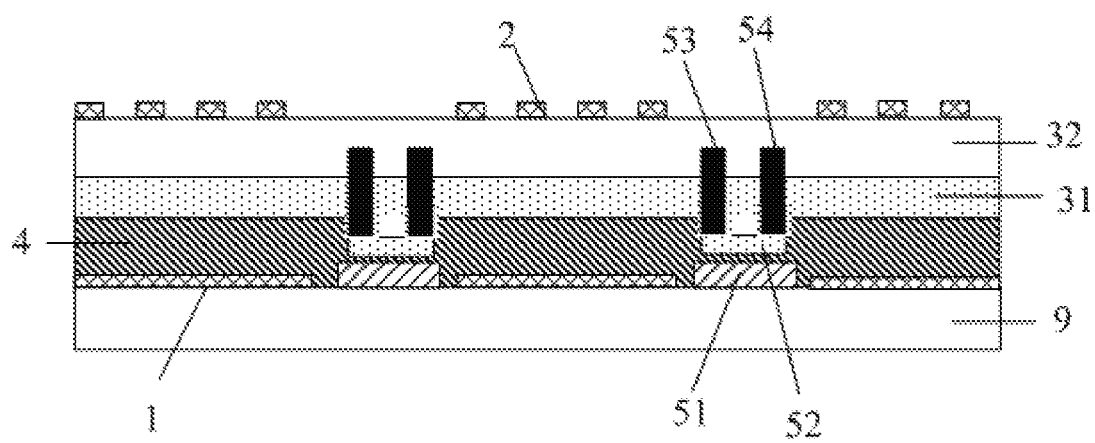
FIG. 8 is a schematic diagram showing a structure of still another array substrate according to an embodiment of the present disclosure.

In the above embodiments, as shown in FIGS. 2 and 3, the array substrate may include a display region and a non-display region. A plurality of thin film transistors are provided on the base substrate 9 in the non-display region, and each of the thin film transistors includes a gate 51, an active layer 52, a source 53, and a drain 54. An insulation layer may be provided between the gate 51 and the active layer 52. The first electrode 1 and the second electrode 2 are provided in the display region, and the first electrode 1 and the gate 51 may be provided in a same layer. The active layer 52 and the film thickness adjustment layer 4 may be provided in a same layer. In a stacking direction (i.e., a direction in which various components of the array substrate are stacked with one on another) of the array substrate, a thickness of the active layer 52 (in the embodiments of FIGS. 6 and 7) or a total thickness of the gate 51 and the active layer 52 which overlap each other (in the embodiment of FIG. 8, in this embodiment, both the gate 51 and the active layer 52 may be provided in a layer where the film thickness adjustment layer 4 is located) may be equal to or less than a minimum thickness of the film thickness adjustment layer 4 after the film thickness adjustment layer 4 shrinks due to being heated, such that a distance between the first electrode 1 and the second electrode 2 reduces as the film thickness adjustment layer 4 shrinks. However, in the present disclosure, the thickness of the thicknesses of the active layer 52, the gate 51 and the film thickness adjustment layer 4 are not limited thereto, as long as the distance between the first electrode 1 and the second electrode 2 is reduced as the film thickness adjustment layer 4 shrinks when the film thickness adjustment layer 4 is heated. In a case where the array substrate is powered on to display, the film thickness adjustment layer 4 shrinks as its temperature increases, and thus a distance between the first electrode 1 and the second electrode 2 reduces. As a result, the storage capacitance Cst increases, and an absolute value of the feed-through voltage ΔVp remains constant or reduces, thereby mitigating or eliminating the flicker defect of the array substrate.

In the embodiment of FIG. 2, the film thickness adjustment layer 4 is provided between the gate insulation layer 31 and the passivation layer 32.

The gate insulation layer 31 covers the first electrode 1 and the gate 51. In the present embodiment, the first electrode 1 proximal to the base substrate 9 serves as a common electrode, and the second electrode 2 distal to the base substrate 9 serves as a pixel electrode. An upper surface of the gate insulation layer 31 covering the first electrode 1 and the gate 51 may be a planar surface, and the film thickness adjustment layer 4 is formed on the upper surface of the gate insulation layer 31 in the display region. As such, in a case where the array substrate is applied to a liquid crystal display panel (as shown in FIG. 4) or a display device, as an operation time period of the liquid crystal display panel or the display device increases, a temperature of a backlight increases gradually, and liquid crystal capacitance (i.e., the liquid crystal capacitance Clc formed by the liquid crystal layer 6) reduces gradually since the liquid crystal display panel or the display device is heated. At the same time, the film thickness adjustment layer 4 shrinks as its temperature increases, and a distance between the pixel electrode (e.g., the second electrode 2) and the common electrode (e.g., the first electrode 1) reduces. Therefore, the storage capacitance Cst increases gradually. The increase of the storage capacitance Cst compensates the reduction of the liquid crystal capacitance Clc. In a case where an amount of the increase of the storage capacitance Cst is equal to an amount of the reduction of the liquid crystal capacitance Clc, the feed-through voltage remains constant, thereby mitigating the flicker defect. In a case where the amount of the increase of the storage capacitance Cst is greater than the amount of the reduction of the liquid crystal capacitance Clc, an absolute value of the feed-through voltage ΔVp reduces (reference may be made to the subsequent description made in conjunction with FIG. 4), thereby mitigating or eliminating the flicker defect.

In the embodiment of FIG. 3, the film thickness adjustment layer 4 is provided between the gate insulation layer 31 and the first electrode 1.

The array substrate shown in FIG. 3 is similar to that shown in FIG. 2 except that, in the array substrate shown in FIG. 3, the film thickness adjustment layer 4 covers the first electrode 1 and the gate 51, and the gate insulation layer 31 is provided on the film thickness adjustment layer 4. The film thickness adjustment layer 4 of the array substrate of the present embodiment can also adjust a distance between the first electrode 1 and the second electrode 2, and increase the storage capacitance Cst. Thus, an absolute value of the feed-through voltage ΔVp may remain constant or reduce, thereby mitigating or eliminating the flicker defect of the array substrate.

In an embodiment, a negative thermal expansion material forming the film thickness adjustment layer 4 includes one or more of metal-ceramic composite, scandium trifluoride crystal, and zirconium tungstate. The negative thermal expansion material shrinks as its temperature increases. In other words, in a certain temperature range, the negative thermal expansion material has a thermal expansion coefficient of negative value.

In an embodiment, the metal-ceramic composite may include $PbTiO_3$, $BaTiO_3$, and the like. In a case where the material is converted from a ferroelectric phase to a paraelectric phase, a volume of the material may shrink. A crystal having a layered network structure or a tubular network structure, such as sodium zirconium phosphate $NaZr_2P_3O_{12}$, has different bond angles for various chemical bonds, which are affected in different degrees due to the change of temperature. For example, as the temperature increases, the crystal having a layered network structure or a tubular network structure has elongated bonds in a first direction, but has unchanged bond length in a second direction due to the interaction between ions. Such difference in bond length change causes reduction of a distance between layers, resulting in a negative thermal expansion phenomenon. Further, a negative thermal expansion phenomenon of a negative thermal expansion material such as zirconium tungstate (e.g., $ZrW_2O_8$) is caused by a polyhedral coupling rotation. It should be noted that the negative thermal expansion material includes, but is not limited to, the materials listed above, and other materials that can cause negative thermal expansion, such as materials with negative thermal expansion caused by a magnetic volume effect, also fall within the scope of the present disclosure, and detailed description thereof is omitted herein.

In an embodiment, a thermal expansion coefficient of the negative thermal expansion material is in a range from about $-27 \times 10^{-6} K^{-1}$ to about $-5 \times 10^{-6} K^{-1}$.

During operations of a display device including the array substrate, a temperature of a backlight of the display device may be about 60° C. in a normal operation state. Thus, the negative thermal expansion material having a thermal expansion coefficient in a range from about $-27 \times 10^{-6} K^{-1}$ to about $-5 \times 10^{-6} K^{-1}$ may be employed herein. That is, the negative thermal expansion material having a thermal expansion coefficient in a range from about $-27 \times 10^{-6} K^{-1}$ to about $-5 \times 10^{-6} K^{-1}$ at least compensates a part of a change of the feed-through voltage ΔVp due to reduction of the liquid crystal capacitance Clc.

As described above, a distance d (as shown in FIG. 4) between the first electrode 1 and the second electrode 2 may change as a temperature of the film thickness adjustment layer 4 changes. In an embodiment, the distance d between the first electrode 1 and the second electrode 2 before the film thickness adjustment layer 4 is heated is H1, and the distance between the first electrode 1 and the second electrode 2 after the film thickness adjustment layer 4 is heated is H2, a difference value between the H1 and the H2 being in a range from about 1 nm to about 10 nm.

In an embodiment, a thickness of the film thickness adjustment layer 4 in the stacking direction may be in a range from about 0.5 μm to about 1 μm. Thus, when the film thickness adjustment layer 4 has a temperature of about 60° C., a difference value between the H1 and the H2 is in the range from about 1 nm to about 10 nm, thereby compensating the change of the feed-through voltage ΔVp due to reduction of the liquid crystal capacitance Clc (i.e., causing the feed-through voltage ΔVp to remain constant). It is easily understood that, in a case where the film thickness adjustment layer 4 has a thickness greater than 1 μm, a difference value between the H1 and the H2 will be greater than 10 nm. As a result, an absolute value of the feed-through voltage ΔVp will reduce, thereby mitigating or eliminating the flicker defect.

It should be understood that the size, thickness, and the like of each of the structural layers shown in the drawings are merely illustrative. In a manufacturing process, areas of the structural layers projected on the base substrate 9 may be equal to or different from each other, and the required projected areas of the structural layers may be achieved by an etching process. Meanwhile, a geometrical shape of each structural layer is not limited to that shown in the drawings, and may be, for example, a rectangle as shown in the drawing, a trapezoid, or other desired shapes realized by etching.

In the array substrate according to any one of the above embodiments of the present disclosure, the first electrode and the second electrode are insulated from each other, and the film thickness adjustment layer made of a negative thermal expansion material is provided between the first electrode and the second electrode. In a case where the array substrate is powered on to operate, the film thickness adjustment layer shrinks as its temperature increases, and thus a distance between the first electrode and the second electrode reduces, thereby increasing the storage capacitance (or referred to as pixel storage capacitance) formed between the first electrode and the second electrode. As a result, an absolute value of the feed-through voltage remains constant or reduces, thereby mitigating or eliminating the flicker defect of the array substrate. The array substrate provided by the present disclosure may be applied to various liquid crystal display panels and display devices, for example, to a display device of ADS mode.

An embodiment of the present disclosure provides a liquid crystal display panel. As shown in FIG. 4, the liquid crystal display panel may include the array substrate according to any one of the above embodiments of the present disclosure.

In an embodiment, as shown in FIG. 4, the liquid crystal display panel may further include a color filter substrate 7. Liquid crystal (or a liquid crystal layer) 6 may be provided between the color filter substrate 7 and the array substrate. Color filters 71 are provided on the color filter substrate 7 in positions corresponding to the display region, and include a red (R) region (e.g., a pixel or a sub-pixel), a green (G) region (e.g., a pixel or a sub-pixel), and a blue (B) region (e.g., a pixel or a sub-pixel). A black matrix 72 is provided on the color filter substrate 7 in positions corresponding to the non-display region. The black matrix 72 and the color filters 71 may be provided in a same layer, and may be provided on a surface of a base substrate 73 proximal to the liquid crystal 6.

In an embodiment, a dielectric coefficient ε of the liquid crystal 6 changes over a temperature as shown in the following table 1. In the table 1, the parameter $\varepsilon_{//}$ denotes a dielectric coefficient of the liquid crystal 6 in a direction parallel to the long axis of a molecule of the liquid crystal, the parameter $\varepsilon\perp$ denotes a dielectric coefficient of the liquid crystal 6 in a direction perpendicular to the long axis of the molecule of the liquid crystal, the parameter $\Delta\varepsilon=\varepsilon_{//}-\varepsilon\perp$. It can be seen from table 1 that, the parameter Δε of the liquid crystal 6 reduces as the temperature increases.

TABLE 1

|  | $\varepsilon_{//}$ | $\varepsilon_\perp$ | Δε |
| --- | --- | --- | --- |
| 20° C. | 5.3 | 2.6 | 2.7 |
| 25° C. | 5.2 | 2.6 | 2.6 |
| 40° C. | 4.9 | 2.6 | 2.3 |
| 50° C. | 4.7 | 2.6 | 2.1 |

A high voltage (i.e., a turned-on voltage) Vgh at the gate 51, a low voltage (i.e., a turned-off voltage) Vgl at the gate 51, the liquid crystal capacitance Clc of the liquid crystal (or the liquid crystal layer) 6, the pixel storage capacitance (i.e., the capacitance formed between the first electrode 1 and the second electrode 2) Cst, a coupling capacitance (i.e., the capacitance formed between the gate 51 and the source 54 of the thin film transistor) Cgs, and the feed-through voltage ΔVp establish the following equation:

$$\Delta Vp = \frac{Cgs}{Cgs + Clc + Cst}(Vgl - Vgh).$$

Further, the liquid crystal capacitance Clc establishes the following equation:

$$Clc = \frac{\varepsilon \cdot \Delta\varepsilon \cdot A}{l},$$

where the parameter A is an area of the liquid crystal layer 6 in a direction perpendicular to the stacking direction, and the parameter l is a thickness of the liquid crystal layer 6 in a direction parallel to the stacking direction.

As a time period for normal operations of the liquid crystal display panel increases, a temperature of the backlight thereof increases, and the liquid crystal capacitance Clc decreases gradually due to the liquid crystal 6 being heated. Referring to table 1, when the temperature increases, the parameter $\Delta\varepsilon$ decreases. Thus, the liquid crystal capacitance Clc decreases accordingly. At the same time, the film thickness adjustment layer 4 shrinks as its temperature increases, the distance d between the pixel electrode and the common electrode reduces (e.g., reduces from H1 to H2), causing the storage capacitance Cst to increase. As a result, an absolute value of the feed-through voltage $\Delta Vp$ remains constant or reduces, thereby mitigating or eliminating the flicker defect of the liquid crystal display panel.

Hereinafter, description is made by taking the case where the film thickness adjustment layer 4 is made of a compound of $LaFe_{10.5}Co_{1.0}Si_{1.5}$ and a backlight of the liquid crystal display panel has a temperature of about 60° C. during normal operations as an example.

The compound of $LaFe_{10.5}Co_{1.0}Si_{1.5}$ has a thermal expansion coefficient of $-26.1 \times 10^{-6} K^{-1}$ in a temperature range of 240 K-350 K. At a Kelvin temperature of 333 K (equal to 273+60, i.e., 60 Celsius degrees), the film thickness adjustment layer 4 has a thermal expansion rate of $-8.7 \times 10^{-3}$ (i.e., $-26.1 \times 10^{-6} K^{-1} * 333 K = -0.0087$), and a distance between the pixel electrode (e.g., the second electrode 2) and the common electrode (e.g., the first electrode 1) is decreased by 0.87%. Thus, the storage capacitance Cst therebetween is increased by 0.87%, thereby compensating a part of the change of the feed-through voltage $\Delta Vp$ due to the reduction of the liquid crystal capacitance Clc.

Similarly, in an example where the film thickness adjustment layer 4 is made of $ZrW_2O_8$ and the backlight has a temperature of 60° C. during normal operations, the thermal expansion coefficient of $ZrW_2O_8$ is $-8.7 \times 10^{-6} K^{-1}$, and the temperature of 60° C. can be converted into a Kelvin temperature of 273+60=333 K. Thus, the film thickness adjustment layer 4 has an expansion rate of $-2.9*10^{-3}$ (i.e., $-8.7 \times 10^{-6} * 333 = -0.0029$) after being heated. Based on the assumption that an area of the film thickness adjustment layer 4 in a direction perpendicular to the stacking direction remains unchanged, a change rate of a thickness of the film thickness adjustment layer 4 is −0.0029. That is, in a case where the film thickness adjustment layer 4 has a thickness of 1 μm before being heated, the film thickness adjustment layer 4 has a thickness of 0.997 μm after being heated.

It should be noted that, the liquid crystal display panel including the array substrate as shown in FIG. 2 is shown in FIG. 4 as an example, but the present disclosure is not limited thereto. For example, the liquid crystal display panel shown in FIG. 4 may include the array substrate as shown in FIG. 1 or 3.

Figure 5:
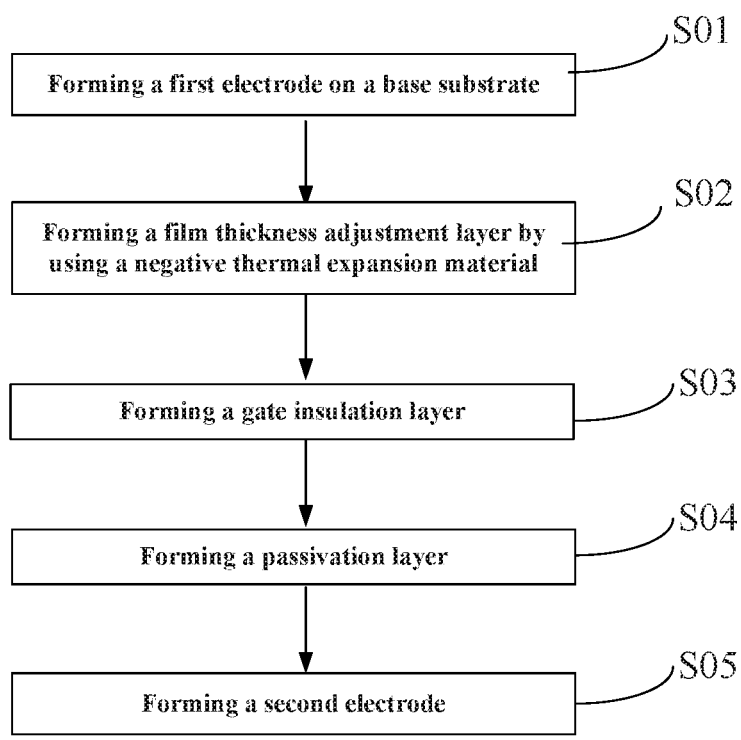
FIG. 5 is a flowchart showing a method for manufacturing an array substrate according to an embodiment of the present disclosure.

An embodiment of the present disclosure provides a method for manufacturing an array substrate. As shown in FIGS. 3 and 5, the method may include the following steps S01 to S05.

Step S01 includes forming a first electrode 1 on a base substrate 9. For example, the base substrate 9 may be made of a transparent material such as glass, and may be pre-cleaned.

In an embodiment, a first metal layer may be formed by using a deposition process, and may be patterned to obtain a gate 51 of a thin film transistor and the first electrode 1. A material forming the first metal layer may include, but is not limited to one or more of the metal materials of Al, Mo, Cu, Ag, Cr, Ti, AlNi, MoTi, and the like.

Step S02 includes forming a film thickness adjustment layer 4 on the first electrode 1 by using a negative thermal expansion material. For example, a layer of negative thermal expansion material may be formed on the first electrode 1 by using a coating process. The negative thermal expansion material may be one or more of metal-ceramic composite, scandium trifluoride crystal, and zirconium tungstate.

Step S03 includes forming a gate insulation layer 31 on the film thickness adjustment layer 4. For example, the gate insulation layer 31 may be formed on the base substrate 9 on which the foregoing steps have been finished, by using a plasma enhanced chemical vapor deposition process, a low pressure chemical vapor deposition process, an atmospheric pressure chemical vapor deposition process, an electron cyclotron resonance chemical vapor deposition process, or a sputtering process.

Step S04 includes forming a passivation layer 32 on the gate insulation layer 31. For example, the passivation layer 32 may be formed by using a plasma enhanced chemical vapor deposition process, a low pressure chemical vapor deposition process, an atmospheric pressure chemical vapor deposition process, or an electron cyclotron resonance chemical vapor deposition process. In particular, the passivation layer 32 may be formed by using a single layer of silicon oxide or by using a stacked layer of a plurality of sub-layers made of silicon oxide and silicon nitride.

Step S05 includes forming a second electrode 2 on the passivation layer 32. For example, the second electrode 2 may be connected to the drain 54 through a via (not shown) in the passivation layer 32. For example, a conductive metal film may be formed by using a sputtering process, a thermal evaporation process, a plasma enhanced chemical vapor deposition process, a low pressure chemical vapor deposition process, an atmospheric pressure chemical vapor deposition process, or an electron cyclotron resonance chemical vapor deposition, and then is patterned to form the second electrode 2. A material of the second electrode 2 may be the same as that of the first electrode 1.

It should be noted that, the step S02 of forming the film thickness adjustment layer 4 may be performed after the step S03 of forming the gate insulation layer 31 is performed, and in such a case, the resultant product is that shown in FIG. 2. A method for manufacturing the array substrate shown in FIG. 1 may be the same as that for manufacturing the array substrate shown in FIG. 2.

It should be noted that, the foregoing embodiments may be implemented in various manners. For example, parameters of each step may be adjusted as desired, and manufacturing steps for different products may be changed according to practical applications.

An embodiment of the present disclosure provides a display device including the liquid crystal display panel provided by any one of the embodiments of the present disclosure. The display device may be any product or component having a display function, such as a liquid crystal display panel, electronic paper, a mobile phone, a tablet computer, a television set, a monitor, a laptop computer, a digital photo frame, a navigator, and the like.

The foregoing embodiments can be combined with each other in a case where there is no conflict therebetween.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. An array substrate, comprising:
   a first electrode;
   a second electrode;
   an insulation layer provided between the first electrode and the second electrode; and
   a film thickness adjustment layer provided between the first electrode and the second electrode, made of a negative thermal expansion material, and configured to adjust a distance between the first electrode and the second electrode,
   wherein the insulation layer comprises a gate insulation layer and a passivation layer, and the gate insulation layer is proximal to the first electrode relative to the passivation layer, and
   wherein the film thickness adjustment layer is provided between the sate insulation layer and the first electrode.

2. The array substrate according to claim 1, wherein the negative thermal expansion material comprises at least one of metal-ceramic composite, scandium trifluoride crystal, and zirconium tungstate.

3. The array substrate according to claim 1, wherein the film thickness adjustment layer is provided between the gate insulation layer and the passivation layer.

4. The array substrate according to claim 3, further comprising a thin film transistor, wherein the thin film transistor comprises an active layer and a gate, the active layer is provided in the film thickness adjustment layer, and the gate and the first electrode are provided on a surface of a base substrate proximal to the film thickness adjustment layer.

5. The array substrate according to claim 4, wherein a thickness of the active layer is equal to or less than a minimum thickness of the film thickness adjustment layer after the film thickness adjustment layer shrinks due to being heated.

6. The array substrate according to claim 1, wherein a thermal expansion coefficient of the negative thermal expansion material is in a range from about $-27 \times 10^{-6} K^{-1}$ to about $-5 \times 10^{-6} K^{-1}$.

7. The array substrate according to claim 1, further comprising a thin film transistor, wherein the thin film transistor comprises an active layer and a gate which are provided in the film thickness adjustment layer, and the active layer and the gate overlap each other in a stacking direction of the insulation layer and the film thickness adjustment layer of the array substrate.

8. The array substrate according to claim 7, wherein a total thickness of the gate and the active layer is equal to or less than a minimum thickness of the film thickness adjustment layer after the film thickness adjustment layer shrinks due to being heated.

9. The array substrate according to claim 1, wherein a thickness of the film thickness adjustment layer is greater than about 0.5 μm.

10. A liquid crystal display panel, comprising the array substrate according to claim 1.

11. The liquid crystal display panel according to claim 10, further comprising a color filter substrate, wherein a liquid crystal layer is provided between the color filter substrate and the array substrate, a turned-on voltage Vgh at a gate of a thin film transistor of the array substrate, a turned-off voltage Vgl at the gate, a liquid crystal capacitance Clc of the liquid crystal layer, a storage capacitance Cst formed between the first electrode and the second electrode, a coupling capacitance Cgs between the gate and a source of the thin film transistor, and a feed-through voltage ΔVp establish the following equation:

$$\Delta Vp = \frac{Cgs}{Cgs + Clc + Cst}(Vgl - Vgh);$$

and
an absolute value of the feed-through voltage ΔVp remains constant or reduces.

12. A display device, comprising the liquid crystal display panel according to claim 10.

13. An array substrate, comprising;
   a first electrode;
   a second electrode;
   an insulation layer provided bet een the first electrode and the second electrode; and
   a film thickness adjustment layer provided between the first electrode and the second electrode, made of a negative thermal expansion material, and configured to adjust a distance between the first electrode and the second electrode,
   wherein a distance between the first electrode and the second electrode before the film thickness adjustment layer is heated is H1, and a distance between the first electrode and the second electrode after the film thickness adjustment layer is heated is H2, a difference value between the H1 and the H2 being greater than about 1 nm.

14. A liquid crystal display panel, comprising the array substrate according to claim 13.

15. The liquid crystal display panel according to claim 14, further comprising a color filter substrate, wherein a liquid crystal layer is provided between the color filter substrate and the array substrate, a turned-on voltage Vgh at a gate of a thin film transistor of the array substrate, a turned-off voltage Vgl at the gate, a liquid crystal capacitance Clc of the liquid crystal layer, a storage capacitance Cst formed between the first electrode and the second electrode, a coupling capacitance Cgs between the gate and a source of the thin film transistor, and a feed-through voltage ΔVp establish the following equation:

$$\Delta Vp = \frac{Cgs}{Cgs + Clc + Cst}(Vgl - Vgh);$$

and
an absolute value of the feed-through voltage ΔVp remains constant or reduces.

16. A didisplay device, comprising the liquid crystal display panel according to claim 14.

17. A method for manufacturing an array substrate, comprising steps of:
- forming a first electrode;
- forming a film thickness adjustment layer on the first electrode by using a negative thermal expansion material;
- forming an insulation layer on the film thickness adjustment layer; and
- forming a second electrode on the insulation layer;
- wherein the insulation layer is provided between the first electrode and the second electrode, and
- wherein the step of forming an insulation layer on the film thickness adjustment layer comprises a step of forming a gate insulation layer and a passivation layer on the film thickness adjustment layer, so that the gate insulation layer is proximal to the first electrode relative to the passivation layer.

18. The method according to claim 17, wherein the step of forming a film thickness adjustment layer on the first electrode by using a negative thermal expansion material comprises a step of forming a film thickness adjustment layer on the first electrode by using at least one of metal-ceramic composite, scandium trifluoride crystal, and zirconium tungstate.

19. The method according to claim 17, wherein the step of forming a film thickness adjustment layer on the first electrode by using a negative thermal expansion material comprises a step of forming a film thickness adjustment layer on the first electrode by using a negative thermal expansion material having a thermal expansion coefficient in a range from about $-27 \times 10^{-6} K^{-1}$ to about $-5 \times 10^{-6} K^{-1}$.

20. The method according to claim 17, wherein the step of forming a film thickness adjustment layer comprises a step of forming a film thickness adjustment layer having a thickness greater than about 0.5 μm.

* * * * *